(12) United States Patent
Jones et al.

(10) Patent No.: US 11,079,532 B2
(45) Date of Patent: Aug. 3, 2021

(54) DIGITIZED GRATING PERIOD

(71) Applicant: Intel Corporation, Santa Clara, CA (US)

(72) Inventors: Richard Jones, San Mateo, CA (US); Ming Guo, Cupertino, CA (US); Mahtab Hakami, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 811 days.

(21) Appl. No.: 15/702,544

(22) Filed: Sep. 12, 2017

(65) Prior Publication Data

US 2019/0079237 A1 Mar. 14, 2019

(51) Int. Cl.
*H01S 5/12* (2021.01)
*F21V 8/00* (2006.01)
*H01S 5/125* (2006.01)
*H01S 5/10* (2021.01)
*G02B 6/02* (2006.01)
*G02B 6/124* (2006.01)
*G01J 3/18* (2006.01)
*H01S 5/042* (2006.01)
*H01S 5/02* (2006.01)
*H01S 5/227* (2006.01)

(52) U.S. Cl.
CPC ....... *G02B 6/0026* (2013.01); *G02B 6/02095* (2013.01); *G02B 6/124* (2013.01); *H01S 5/1003* (2013.01); *H01S 5/1032* (2013.01); *H01S 5/125* (2013.01); *H01S 5/1218* (2013.01); *H01S 5/1231* (2013.01); *G01J 3/1895* (2013.01); *H01S 5/021* (2013.01); *H01S 5/04257* (2019.08); *H01S 5/227* (2013.01)

(58) Field of Classification Search
CPC .... H01S 5/1003; H01S 5/1032; H01S 5/1231; H01S 5/125; H01S 5/04257; H01S 5/021; H01S 5/227; H01S 5/1218; G02B 6/0026; G02B 6/02095; G02B 6/124; G01J 3/1895

See application file for complete search history.

(56) References Cited

U.S. PATENT DOCUMENTS

| | | | | |
|---|---|---|---|---|
| 2003/0063647 | A1* | 4/2003 | Yoshida | H01S 5/06256 372/50.1 |
| 2010/0272135 | A1* | 10/2010 | Kuksenkov | H01S 5/0657 372/22 |
| 2013/0321900 | A1* | 12/2013 | Vallius | G02F 1/3558 359/328 |

* cited by examiner

*Primary Examiner* — Michael Carter
(74) *Attorney, Agent, or Firm* — Schwabe, Williamson & Wyatt, P.C.

(57) ABSTRACT

Embodiments of the present disclosure may relate to a digitized grating that may include a first unit cell that has a first period and a first length, where the first period includes a first grating element width and a first space between adjacent grating elements, and where the first length includes a number of first periods. The digitized grating may further include a second unit cell that has a second period and a second length, where the second period is different than the first period and includes a second grating element width and a second space between adjacent grating elements, and where the second length includes a number of second periods.

7 Claims, 6 Drawing Sheets

DIGITIZED GRATING PERIOD

FIELD

Embodiments of the present disclosure relate generally to the field of optical devices. More particularly, embodiments of the present disclosure relate to Bragg gratings, semiconductor lasers, and digitized grating period.

BACKGROUND

Optical devices, such as lasers, amplifiers, or photodetectors, may be made from light-emitting and absorbing electro-optic properties of semiconductor materials. Optical devices may include an active region, where charge carriers may generate light, and a waveguide that may carry the light. A waveguide may have a grating period that may affect the wavelength of emitted, reflected or transmitted light. The ability to vary a grating period of a waveguide may enable the ability to vary, for example, the wavelength of emitted light from a laser.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure may relate to a digitized grating that may include a first unit cell that has a first period and a first length, where the first period includes a first grating element width and a first space between adjacent grating elements, and where the first length includes a number of first periods. The digitized grating may further include a second unit cell that has a second period and a second length, where the second period is different than the first period and includes a second grating element width and a second space between adjacent grating elements, and where the second length includes a number of second periods. In this way, a Bragg wavelength of a waveguide that includes the digitized grating may be set with more accuracy or precision.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Figure 1:
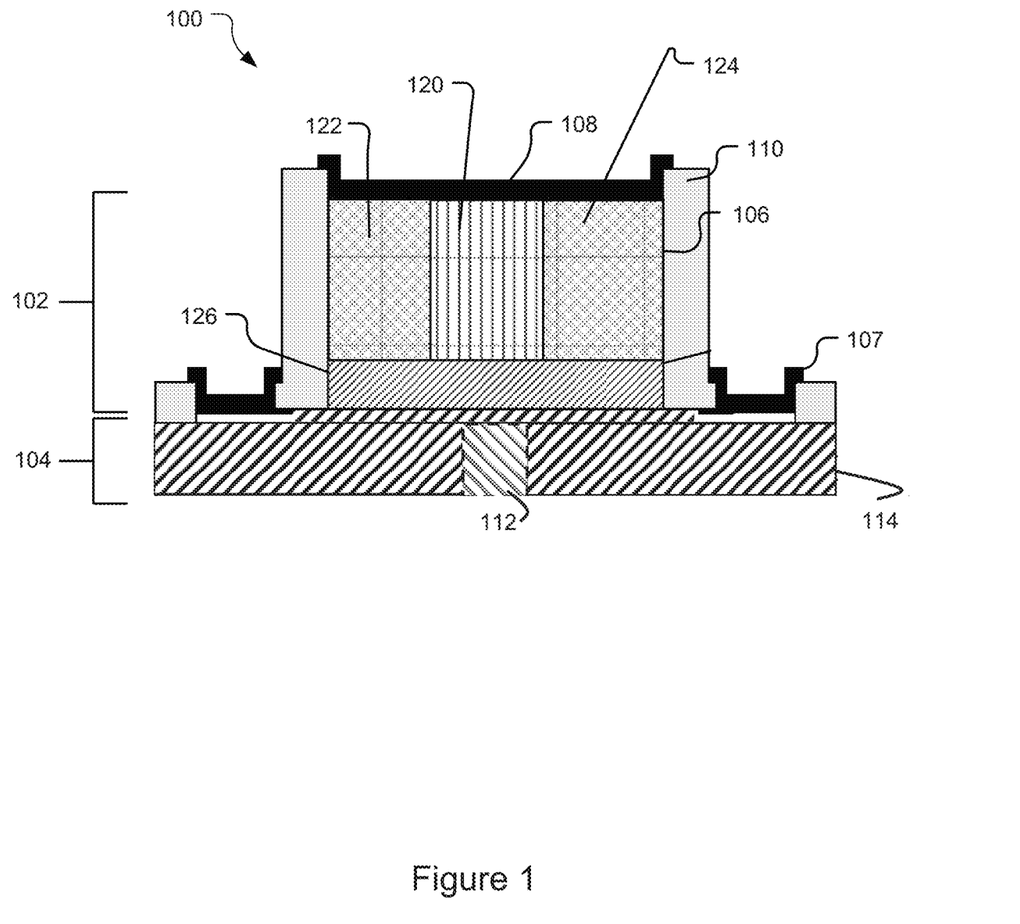
FIG. 1 depicts a cross-section view of an example laser, in accordance with various embodiments.

FIG. 1 depicts a cross-section view of an example laser, in accordance with various embodiments. Laser 100 may include a first semiconductor region 102 and a second semiconductor region 104 coupled with the first semiconductor region 102. Laser 100 may be, for example, a Distributed Bragg Feedback ("DFB") laser or a Distributed Bragg Reflector ("DBR") laser. Laser 100 may be, for example, an in-plane laser or any other type of laser. Although embodiments herein are described with regard to a laser, embodiments herein may relate to optical filters, dispersion compensators, modulators or any type of optical device. The first semiconductor region 102 and the second semiconductor region 104 may be formed of any suitable material or materials for forming an optical device such as a laser, for example silicon, or, for example, silicon dioxide (SiO2), polymer, indium phosphide (InP), gallium arsenide (GaAs), or other compound semiconductor materials.

The first semiconductor region 102 may include an active region 106 and one or more electrical contacts 107, 108 coupled with the active region 106 to provide an electrical current to the active region 106. Alternatively or additionally, an active region may be referred to as a gain region. In some embodiments, the active region 106 may include a current channel 120, implanted layers 122, 124, and a multiple quantum well ("MQW") layer 126. The first semiconductor region 102 may include an insulating material 110 that may cover portions of the active region 106 and/or the first semiconductor region 102. First semiconductor region 102 may include additional or alternative layers.

The second semiconductor region 104 may include an optical waveguide 112. The optical waveguide 112 may carry an optical signal, for example, light. In some embodiments, the second semiconductor region 104 may include a layer 114. In some embodiments, the layer 114 may be, for example, a device fabrication wafer or epitaxial silicon. The layer 114 may provide a path of electric current to the contacts 107 or 108. The layer 114 may extend laterally on either side of the active region 106 to connect with the electrical contacts 107. Second semiconductor region 104 may include additional or alternative layers.

Figure 2:
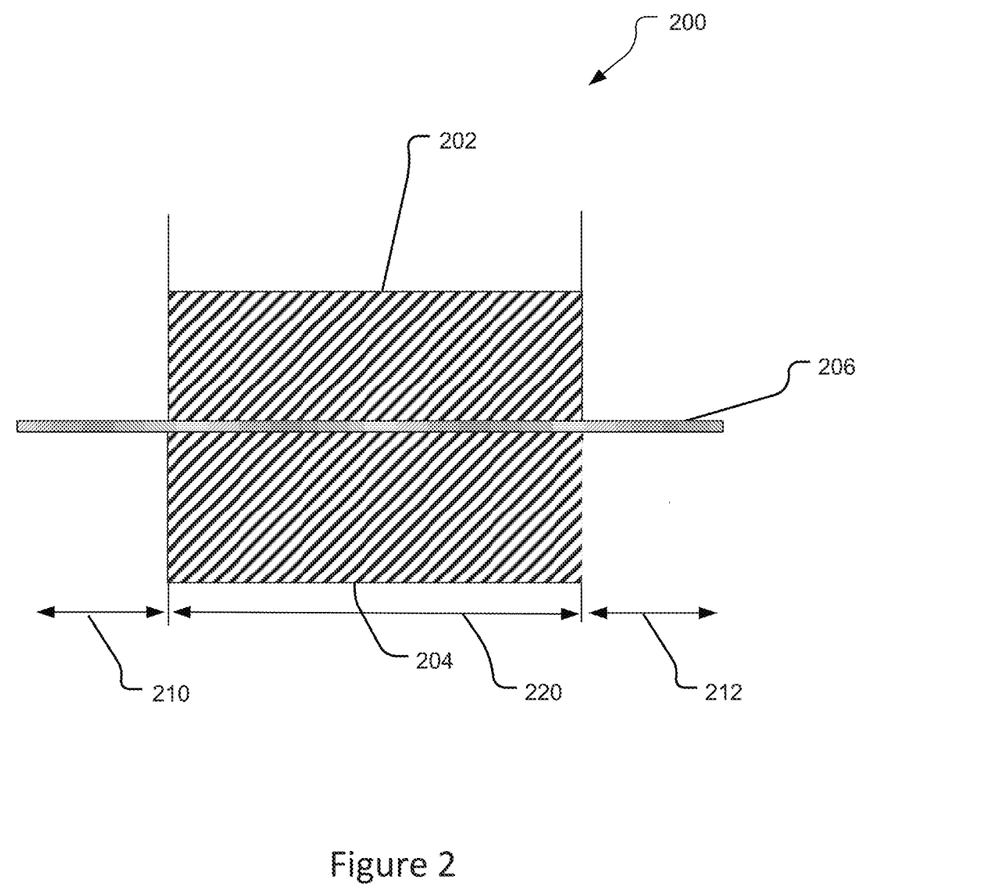
FIG. 2 depicts a top-down view of an example laser, in accordance with various embodiments.

FIG. 2 depicts a top-down view of an example laser, in accordance with various embodiments. Laser 200 may include the semiconductor region structure described in reference to FIG. 1, in accordance with various embodiments. Laser 200 may be, for example, a DFB laser or a DBR laser. Laser 200 may be, for example, an in-plane laser or any other type of laser. Although embodiments herein are described with regard to a laser, embodiments herein may relate to any type of optical device. Laser 200 may include a first semiconductor region 202 and a second semiconductor region 204 (shown and viewed partially through the first semiconductor region 202), which may be similar to embodiments described in reference to FIG. 1. The second semiconductor region 204 may include an optical waveguide 206. An active region 220 may include the first semiconductor region 202 and second semiconductor region 204.

In some embodiments, laser 200 may be coupled with a light input component 210 and the light output component 212. Light input component 210 and a light output component 212 may be coupled with the laser 200 directly. Alternatively, light input component 210 and light output component 212 may be coupled with the laser 200 through, for example, mode converters that may provide coupling efficiency between the laser 200 and the light input component 210 and light output component 212, in order to reduce optical loss, for example.

Figure 3:
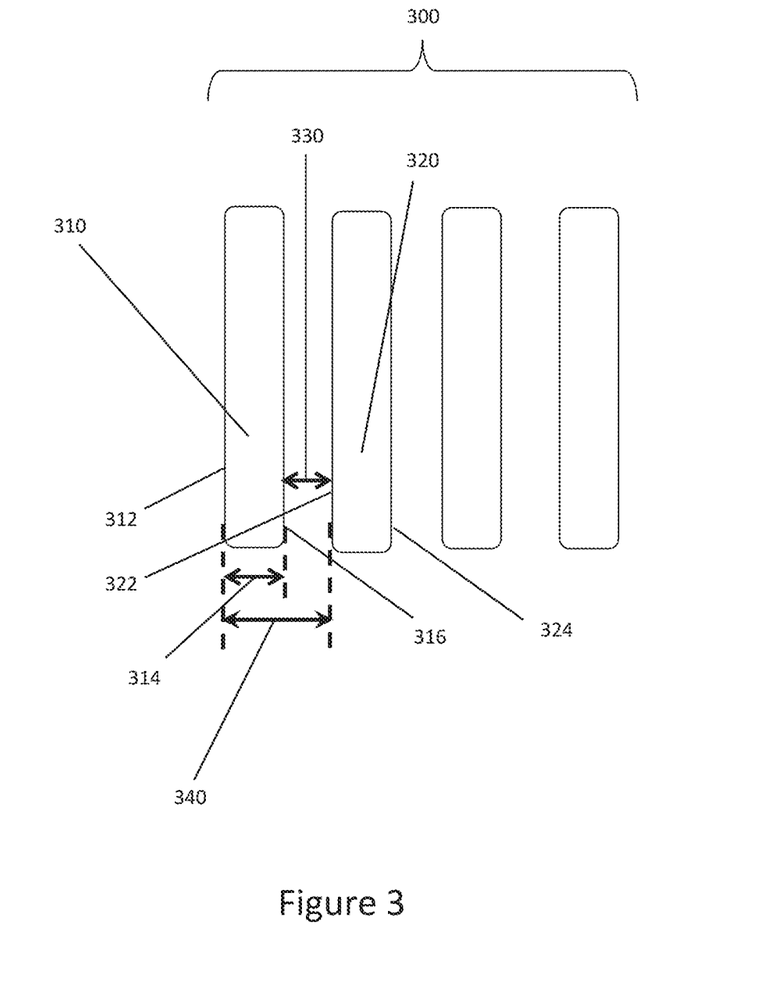
FIG. 3 depicts an example unit cell, in accordance with various embodiments.

FIG. 3 depicts an example unit cell, in accordance with some embodiments. Unit cell 300 may include, for example, a first grating element 310 and a second grating element 320. Alternatively or additionally, a grating element may be referred to as an element. A grating element, for example, first grating element 310, may include a front edge, for example, front edge 312, a width, for example, width 314, and a back edge, for example, back edge 316. Another grating element, for example, second grating element 320, may include a front edge 322 and a back edge 324. Unit cell 300 may further include a space 330 between two adjacent grating elements, for example, between first grating element 310 and second grating element 320.

Unit cell 300 may further include a period 340. Period 340 may be, for example, a distance measured from a front edge of one grating element, for example, front edge 312 of first grating element 310, to a front edge of an adjacent grating element, for example front edge 322 of second grating element 320. Accordingly, period 340 may include a width of a first grating element, which may be referred to herein as a grading element width, e.g., width 314 of first grating element 310, and a space between adjacent grating elements (or simply a space between grating elements), e.g., space 330. Although FIG. 3 is depicted as having a period that includes a grating element width followed by a space between adjacent grating elements, embodiments herein may have a period that includes a space between adjacent grating elements followed by a grating element width. Although FIG. 3 is depicted as including one unit cell that includes four grating elements, embodiments herein may include any number of unit cells that include any number of grating elements.

A period, e.g., period 340, may affect the wavelength of light reflected by a grating in a waveguide, e.g., waveguide 206. In a grating, a portion of light may be reflected at an interface of each grating element, e.g., front edge 312, front edge 322, back edge 316, or back edge 324. For purposes of illustration and ease of explanation, the reflection of light is described with reference to two grating elements. However, the reflection of light as described herein is not limited to a situation involving two grating elements. Any number of grating elements may be involved in the reflection of light.

Reflected light may combine at a particular wavelength. This may be referred to as, e.g., the Bragg condition, and the wavelength at which light may combine may be referred to as, e.g., the Bragg wavelength. Light signals at wavelengths other than the Bragg wavelength, may be, for example, be transmitted by the grating. The Bragg wavelength, which may be denoted by, e.g., $\lambda$Bragg, may be determined by the following equation: $\lambda$Bragg=2.$\Lambda$.neff. In the foregoing equation, $\Lambda$ may represent the grating period of a waveguide, and neff may represent the effective index of the waveguide, which, alternatively or additionally, may be referred to as the effective refractive index of the waveguide. The effective index may, for example, quantify the velocity of propagating light as compared to its velocity in a vacuum.

The Bragg wavelength may be the emission wavelength of a laser, such as, for example, laser 100 or laser 200. Additionally or alternatively, the emission wavelength of a laser may be referred to as the laser wavelength. Based on, for example, the above equation, varying a waveguide's grating period or effective index may vary the Bragg wavelength.

A grating may be manufactured using, for example, a photomask, which, alternatively or additionally, may be referred to as a mask. For example, a mask may be placed between a light source and a photosensitive material. The shadow of the mask, where light does not pass through the mask to the photosensitive material, may determine the structure of the grating elements and unit cells of a grating, based on the intensity of the light that passes through openings in the mask and strikes the surface of the photosensitive material.

The accuracy or precision of a Bragg wavelength may be affected by the resolution of a mask, which may also be referred to as the mask resolution. Additionally or alternatively, the mask resolution may be referred to as the grid size of the mask. For purposes of illustration and ease of explanation, and not by way of limitation, if, for example, a mask has a mask resolution of 1 nanometer (nm), the grating period of a grating manufactured using that mask may be set at, for example, 1 nm steps or intervals. This may result, for example, in an ability to set a Bragg wavelength with an accuracy or precision of +/−6 nm to +/−8 nm, if neff is 3 or 4, respectively. This may mean, for example, that if a laser may have a stated Bragg wavelength of X nm, the actual Bragg wavelength may be within 6 nm to 8 nm of the stated Bragg wavelength. Consequently, for example, an application that would need the Bragg wavelength to be accurate to within, for example, +/−3 nm, may be difficult to accommodate.

Thus, a challenge may be, for example, how to vary the Bragg wavelength in order to provide a Bragg wavelength, and thus a laser wavelength, that is more accurate or precise. An approach may be to, for example, use temperature to vary the effective index of a waveguide. This approach, however, may require that the waveguide remain at a fixed temperature in order to achieve the desired Bragg wavelength accuracy or precision. Maintaining a fixed temperature may not be possible for many applications that use a laser. Another approach may be to, for example, vary the width of the waveguide, in order to vary the effective index of the waveguide. This approach, however, may vary other properties that may affect a laser's performance, such as, for example, its MQW confinement factor. Thus, varying the effective index of the waveguide in this way may impact a laser's performance.

Figure 4:
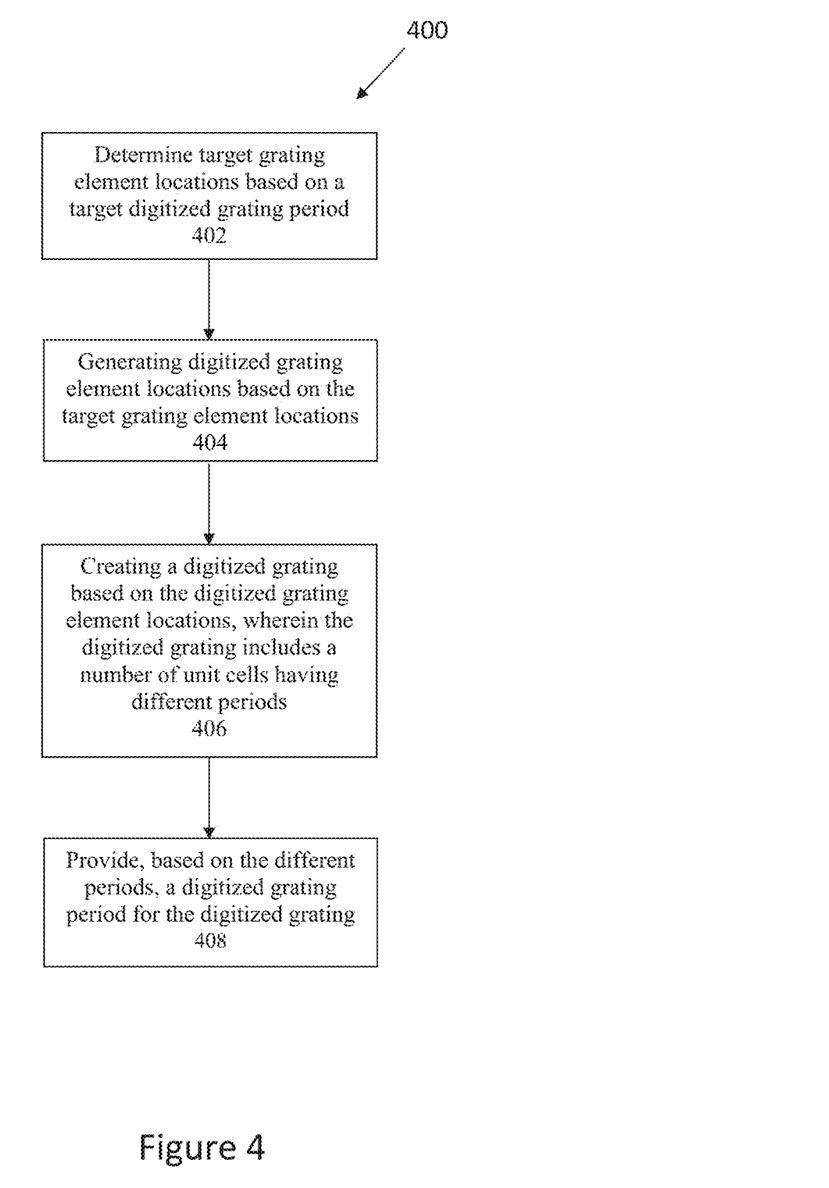
FIG. 4 depicts an example operation flow/algorithmic structure of an electronic device, in accordance with various embodiments.

FIG. 4 depicts an example operation flow/algorithmic structure of an electronic device, in accordance with various embodiments. Operation flow/algorithmic structure 400 may include, at 402, determining target grating element locations based on a target digitized grating period. Alternatively or additionally, a grating element location may be referred to as a grating element position. In some embodiments, an electronic device may tabulate or calculate grating element locations, identify received grating element locations, or otherwise determine grating element locations that are based on a target digitized grating period. In some embodiments, a target digitized grating period may be, for example, a period that is less than a period that would result from the manufacture, without the use of a digitized grating period, of a grating from a mask having a particular mask resolution.

Operation flow/algorithmic structure 400 may further include, at 404, generating digitized grating element locations based on the target element grating element locations. In some embodiments, generating the digitized grating element locations, for example, digitally sampling the target grating element locations on a mask, and digitally sampling may include, for example, digitally sampling at an interval that may correspond to a resolution of the mask, or a mask resolution. In some embodiments, generating the digitized grating element locations may occur, for example, before the mask is drawn, generated, or otherwise created. Operation flow/algorithmic structure 400 may further include, at 406 creating a digitized grating based on marked grating element locations, where the digitized grating includes a number of unit cells having different periods.

Operation flow/algorithmic structure 400 may further include, at 408, providing, based on the different periods, a digitized grating period for the digitized grating. In some embodiments, the digitized grating period may be the target digitized grating period. However, the digitized grating period that is actually created, or generated or provided, may be different than the target digitized grating period. In some embodiments, the digitized grating period is based on a first period of a first unit cell that includes first grating elements, a second period of a second unit cell that includes second grating elements, a length of the first unit cell, and a length of the second unit cell, where the first period is different than the second period.

In some embodiments, a grating may have a period that may be modulated or modified at a regular interval along a grating length to provide a digitized grating period. In some embodiments, the regular interval may be, for example, a number of grating elements, where, for example, a period may be modulated or modified after the occurrence of the number of grating elements, including the spaces between adjacent grating elements or a space before or after a grating element. For purposes of illustration and ease of explanation, and not by way of limitation, a period may be modulated or modified after, for example, eight grating elements in an interval of 10 grating elements along a grating length, where, for example, for eight grating elements, the period may be uniform, and at ninth and tenth grating elements immediately following the eighth grating element, the period may be modulated or modified, and may return to being uniform for eight grating elements immediately following the tenth grating element. The period then may be modulated or modified again at ninth and tenth grating elements immediately following the eighth grating element in a second group of 10 grating elements. This modulation or modification may continue and be repeated for each interval that includes 10 grating elements.

Similarly, in some embodiments, the regular interval may be, for example, a unit cell that includes a number of grating elements, where, for example, a period may be modulated or modified after the occurrence of the unit cell, including the spaces between adjacent unit cells or a space before or after a unit cell. For purposes of illustration and ease of explanation, and not by way of limitation, a period may be modulated or modified after, for example, a first unit cell, where, for example, for period is uniform for the first unit cell, and at a second unit cell immediately following the first unit cell, the period may be modulated or modified, and may return to being uniform for the unit cell immediately following the second unit cell. The period then may be modulated or modified again at the next unit cell. This modulation or modification may continue and be repeated for each interval that includes a unit cell.

In some embodiments, operation flow/algorithmic structure 400 may further include defining the grating based on the digitized grating. In some embodiments, operation flow/algorithmic structure 400 may further include generating the mask based on the digitized grating. In some embodiments, operation flow/algorithmic structure 400 may further include drawing a grating on the mask, for example, drawing the grating on the mask based on the digitized grating.

Figure 5:
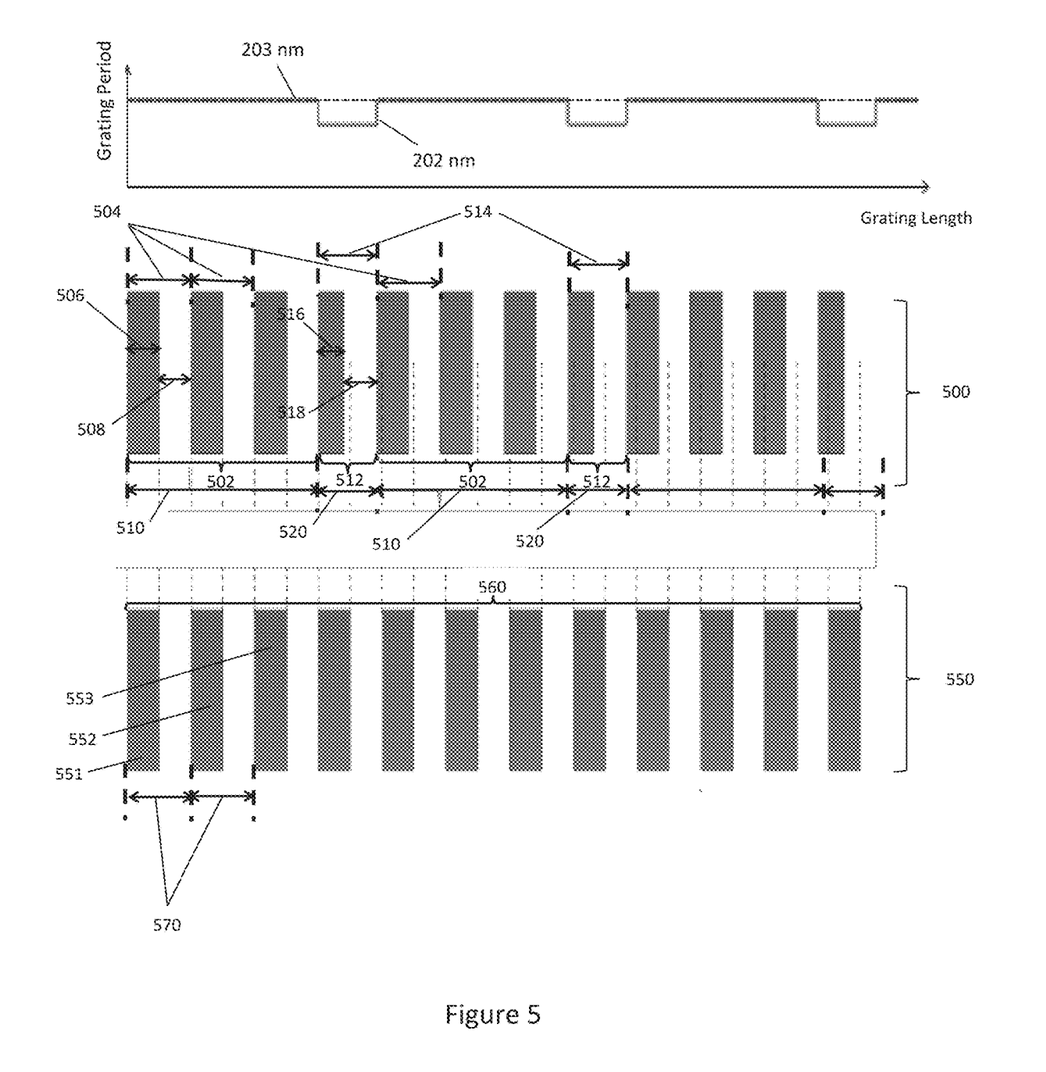
FIG. 5 depicts an example grating, in accordance with various embodiments.

FIG. 5 depicts an example digitized grating, in accordance with various embodiments. Digitized grating 500, which may be referred to herein as grating 500, may include, for example, a first unit cell, for example, unit cell 502, having a first period, for example, period 504, and a first length, for example, length 510, where the first period includes a first grating element width, for example, grating element width 506, and a first space between adjacent grating elements, for example, space 508, and where the first length includes a number of the first periods, for example, a number of the periods 504.

Digitized grating 500 may further include a second unit cell, for example, unit cell 512, having a second period, for example, period 514, and a second length, for example, length 520, where the second period is different than the first period and includes a second grating element width, for example, grating element width 516, and a second space between adjacent grating elements, for example, space 518, and where the second length includes a number of the second periods, for example, a number of the periods 514.

For digitized grating 500, a calculation based on the first period, the first length, the second period and the second length may indicate a digitized grating period. In some embodiments, the digitized grating period may be based on an average that may be based on the first period, the first length, the second period, and the second length. In some embodiments, for example, the digitized grating period may be an average that includes the following: the first period multiplied by the first length, which is added to the second period multiplied by the second length to provide a period sum, and the period sum divided by the sum of the first length and the second length.

For example, by way of illustration and ease of explanation, and not by way of limitation, a digitized grating may include a first unit cell that has a period of 200 nm and a length of 96 periods, and further includes a second unit cell that has a period of 201 nm and a length of 4 periods. The first period multiplied by the first length is 19,200 nm, and the second period multiplied by the second length is 804 nm, for a total of 20,004 nm. The sum of the first length and the second length is 100 periods. Thus, the digitized grating period is 20,004 nm divided by 100, which is 200.04 nm. In some embodiments, the digitized grating period may be the target digitized grating period.

In some embodiments, a mask resolution may be a resolution of a mask used to generate digitized grating 500. In some embodiments, a resolution based on a digitized grating period may be higher than a mask resolution. For example, by way of illustration and ease of explanation, and not by way of limitation, a digitized grating period of 200.04 nm demonstrates a higher resolution than, for example, a mask that has a resolution of 1 nm. Instead of the 1 nm resolution, and thus the ability to have a grating period of either 200 nm or a grating period of 201 nm, the digitized grating period of 200.04 nm falls between 200 nm and 201 nm. In this case, instead of having a resolution of 1 nm, the resolution is 0.04 nm. Although embodiments herein may be described relative to a 1 nm mask resolution, embodiments herein may provide a resolution that is higher relative to any mask resolution. For example, a mask resolution could be 0.1 nm and thus a digitized grating period of 200.04 nm would demonstrate a higher resolution relative to that mask resolution.

Although FIG. 5 is described in terms of two unit cells, digitized grating 500 may include any number of additional unit cells, and thus may include more than two unit cells. Digitized grating 500 may include one or more additional first unit cells and one or more additional second unit cells. Digitized grating 500 may include one or more additional unit cells having one or more additional periods and one or more additional lengths, where the one or more additional periods include one or more additional widths and further include one or more additional spaces between the adjacent grating elements, and where the one or more additional lengths includes a number of the one or more additional periods.

For purposes of comparison, FIG. 5 depicts a grating 550 that includes grating elements 551, 552, and 553 that constitute unit cell 560. Further, unit cell 560 may include a uniform period, for example, uniform period 570, throughout the length of the grating, that is based on a mask resolution. Thus, the period of grating 550 is limited by the mask resolution and would have a Bragg wavelength with less resolution, and thus worse resolution, than the digitized grating.

In some embodiments, the Bragg wavelength of a waveguide that includes digitized grating 500 having a digitized grating period, may be defined with higher resolution than the Bragg wavelength of a waveguide that includes a grating having a uniform grating period that corresponds to a mask resolution. For example, the Bragg wavelength, $\lambda$Bragg, may be determined by the equation described above, $\lambda$Bragg=2.$\Lambda$.neff. For a waveguide that may have, for example, an effective index, neff, the Bragg wavelength may be based on a grating period ($\Lambda$) that is a digitized grating period, which may be defined to a higher resolution than, for example, uniform period 570. Further, the digitized grating period of digitized grating 500 may be defined with a higher resolution than a period of a uniform grating that is based on a mask resolution, such as, for example, grating 550.

In this way, a mask resolution limit on a grating period, and thus a limit on providing a more precise or more accurate Bragg wavelength, may be overcome through use of a digitized grating period. This may enable the ability to, for example, set, with an accuracy or precision of, for example, +/−3 nm, a Bragg wavelength that is based on a digitized grating period, rather than being limited to the ability to, for example, set with an accuracy or precision of, for example, +/−6 nm to +/−8 nm, a Bragg wavelength that is based on a mask resolution.

Use of digitized grating period to provide a more accurate or more precise Bragg wavelength may be independent of other properties of a waveguide, e.g., the waveguide temperature or the waveguide width, that may otherwise be used to provide a more precise or more accurate Bragg wavelength. This may provide the ability to set a grating period, and thus a wavelength of an optical device, for example, a laser, without, for example, varying an effective index of the waveguide or other waveguide properties that may impact laser performance.

In some embodiments, an optical device, for example, laser 200, may include digitized grating 500. In some embodiments, laser 200 may include a first region 202 that may include an active region 220. Laser 200 may further include a second region 204 that may be coupled with the first region 202, where the second region 204 may include optical waveguide 206 to carry light generated in the active region. Optical waveguide 206 may include digitized grating 500, which may be as described herein in accordance with various embodiments.

In some embodiments, for a laser or other optical device, a Bragg wavelength of digitized grating 500 may be defined with a higher resolution than a Bragg wavelength of a grating that includes a uniform grating period that is based on the mask resolution. As explained in more detail above, the digitized grating period may be, for example, an average that may be based on a first period, a first length, a second period, and a second length. In some embodiments, an optical device, for example, laser 200, that includes digitized grating 500 may be a DFB laser or a DBR laser.

Table 1 below illustrates example information, in accordance with some embodiments.

TABLE 1

| Grating Element # | 1 | 2 | 3 | 4 | 5 | 6 | 7 | 8 | 9 | 10 | 11 |
|---|---|---|---|---|---|---|---|---|---|---|---|
| Target Grating Element Location | 0 | 202.75 | 405.5 | 608.25 | 811 | 1013.75 | 1216.5 | 1419.25 | 1622 | 1824.75 | 2027.5 |
| Digitized Grating Element Location | 0 | 203 | 406 | 608 | 811 | 1014 | 1217 | 1419 | 1622 | 1825 | 2028 |
| Period | 203 | 203 | 203 | 202 | 203 | 203 | 203 | 202 | 203 | 203 | ... |

Table 1 may include grating elements, for example, grating elements #1 through #11, and target grating element locations. The target grating element locations may be based on a target digitized grating period. As described above, a target digitized grating period or a digitized grating period may be an effective grating period. For example, the grating element locations may be determined based on a target digitized grating period. For purposes of illustration and ease of explanation, and not by means of limitation, the target digitized grating period may be, for example, 202.75 nm. Thus, for example, in Table 1, grating element #1 may be determined to be at target grating element location 0, grating element #2 may be determined to be at target grating element location 202.75 nm, grating element #3 may be determined to be at target grating element location 405.5 nm, etc., where the target grating element location for each subsequent grating element, relative to the previous grating element, may be determined to be a distance that corresponds to the target digitized grating period.

Table 1 may further include actual grating element locations, where an actual grating element location may be based on a grating element location that may be marked on a mask at an interval that may correspond to a mask resolution, for example, digitally sampled at an interval that may correspond to the mask resolution. For purposes of illustration and ease of explanation, and not by means of limitation, a mask resolution interval may be, for example, 1 nm. Thus, for example, in Table 1, the actual grating element location on a mask used to generate a grating, for example, digitized grating 500, may occur on the mask at the actual grating element locations indicated in Table 1. As illustrated in Table 1, in this example, marking the actual grating element locations on a mask at an interval that may correspond to a mask resolution of 1 nm at actual grating element locations based on a target digitized grating period of 202.75 nm may result in an actual grating element location for grating element #3 that may be 202 nm away from the actual grating element location of grating element #4, whereas grating element #1 is 203 nm away from grating element #2, and similarly, grating element #2 may be 203 nm away from grating element #3.

For a first unit cell, for example, unit cell 502, that may include grating elements #1, #2, and #3 in Table 1, and a second unit cell, for example, unit cell 512, that may include grating element #4 in Table 1, Table 1 may further include a period for the first unit cell, for example, period 504. In Table 1, in the example, the period for the first unit cell is 203. Table 1 may further include a period for the second unit cell, for example, period 514. In Table 1, the period for the second unit cell is 202.

Based on the periods in Table 1 for the first unit cell and the second unit cell and the lengths of the first unit cell and the second unit cell, in this example, a target digitized grating period may be achieved as a digitized grating period that may be an average that may be based on the periods and the lengths of the unit cells. In the example, the target grating period is 202.75 nm. An average that is based on the period of the first unit cell, i.e., 203 nm, multiplied by the length of the first unit cell, i.e., 3 periods; added to the period of the second unit cell, i.e., 202 nm, multiplied by the length of the second unit cell, i.e., 1 period; and the sum divided by the sum of the lengths of the first unit cell and the second unit cell, i.e., 4, results in a digitized grating period of 202.75 nm. Although this example describes providing a digitized grating period based on two unit cells and four grating elements, a digitized grating period may be based on any number of grating elements, any number of target grating element locations, any number of actual grating elements locations, any number of unit cells, and any number periods.

Figure 6:
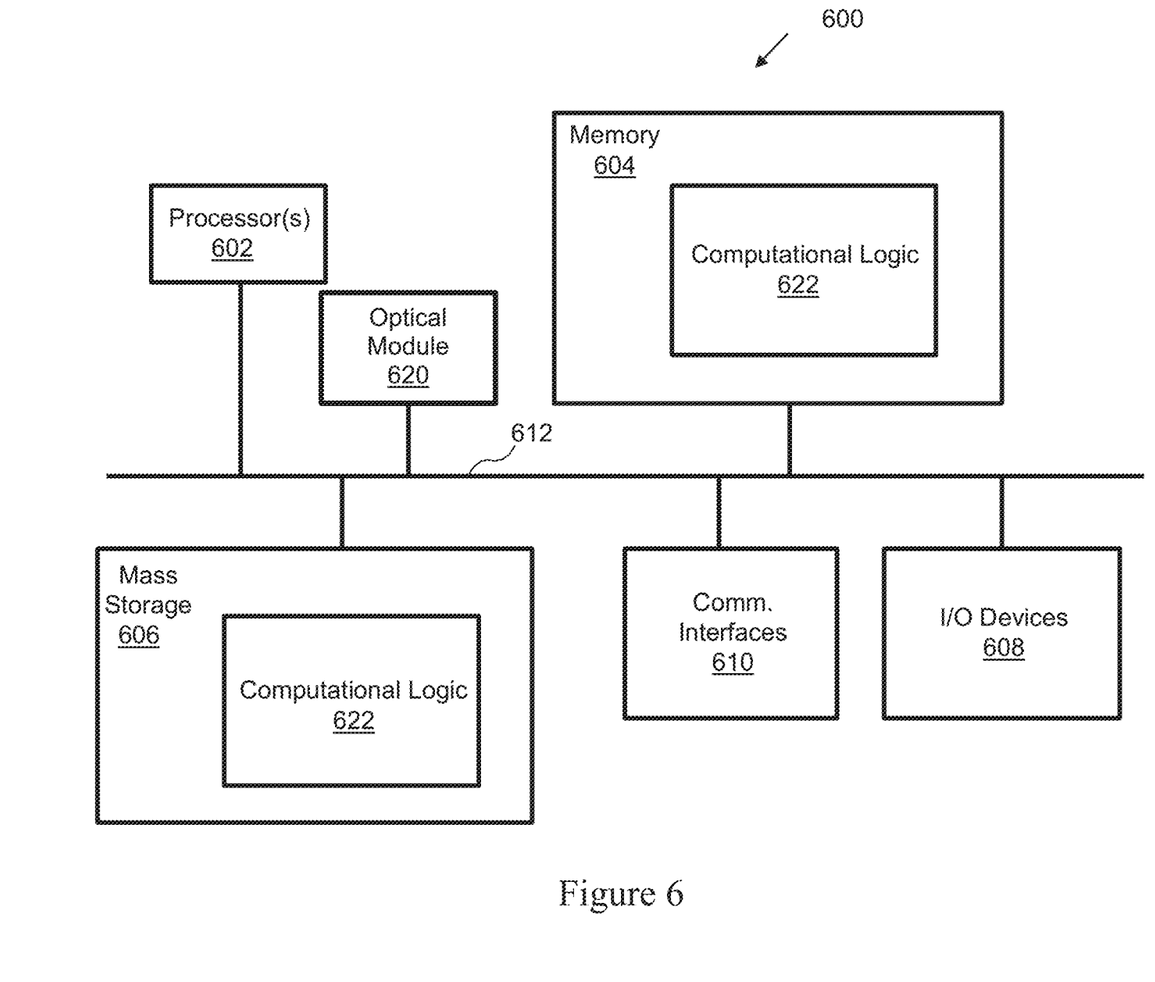
FIG. 6 depicts an example electronic device, in accordance with various embodiments.

FIG. 6 depicts an example electronic device, in accordance with various embodiments. Electronic device 600 may be suitable for use with various components of FIG. 1 or FIG. 2. For example, the electronic device 600 may include an optical module 620 that includes an optical device, for example, laser 100 or laser 200, that includes a waveguide having a grating, for example, digital grating 500. As shown, electronic device 600 may include one or more processors or processor cores 602 and system memory 604. For the purpose of this application, including the claims, the terms "processor" and "processor cores" may be considered synonymous, unless the context clearly requires otherwise. The processor 602 may include any type of processors, such as a central processing unit (CPU), a microprocessor, and the like. The processor 602 may be implemented as an integrated circuit having multi-cores, e.g., a multi-core microprocessor.

The electronic device 600 may include mass storage devices 606 (such as diskette, hard drive, volatile memory (e.g., dynamic random-access memory (DRAM), compact disc read-only memory (CD-ROM), digital versatile disk (DVD), and so forth). In general, system memory 604 and/or mass storage devices 606 may be temporal and/or persistent storage of any type, including, but not limited to, volatile and non-volatile memory, optical, magnetic, and/or solid state mass storage, and so forth. Volatile memory may include, but is not limited to, static and/or dynamic random access memory. Non-volatile memory may include, but is not limited to, electrically erasable programmable read-only memory, phase change memory, resistive memory, and so forth.

The electronic device 600 may further include I/O devices 608 (such as a display (e.g., a touchscreen display)), keyboard, cursor control, remote control, gaming controller, image capture device, a camera, one or more sensors, and so forth) and communication interfaces 610 (such as network interface cards, modems, infrared receivers, radio receivers (e.g., Bluetooth), and so forth).

The communication interfaces 610 may include communication chips (not shown) that may be configured to operate the device 600 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network.

The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond.

The above-described electronic device 600 elements may be coupled to each other via system bus 612, which may represent one or more buses. In the case of multiple buses, they may be bridged by one or more bus bridges (not shown). Each of these elements may perform its conventional functions known in the art. In particular, system memory 604 and mass storage devices 606 may be employed to store a working copy and a permanent copy of the programming instructions for the operation of various components of electronic device 600, including but not limited to an operating system of electronic device 600 and/or one or more applications. The various elements may be implemented by assembler instructions supported by processor(s) 602 or high-level languages that may be compiled into such instructions.

The permanent copy of the programming instructions may be placed into mass storage devices 606 in the factory, or in the field through, for example, a distribution medium (not shown), such as a compact disc (CD), or through communication interface 610 (from a distribution server (not shown)). That is, one or more distribution media having an implementation of the agent program may be employed to distribute the agent and to program various electronic devices.

The number, capability, and/or capacity of the elements 608, 610, 612 may vary, depending on whether electronic device 600 is used as a stationary electronic device, such as a set-top box or desktop computer, or a mobile electronic device, such as a tablet computing device, laptop computer, game console, or smartphone. Their constitutions are otherwise known, and accordingly will not be further described.

In embodiments, memory 604 may include computational logic 622 configured to implement various firmware and/or software services associated with operations of the electronic device 600. For some embodiments, at least one of processors 602 may be packaged together with computational logic 622 configured to practice aspects of embodiments described herein to form a System in Package (SiP) or a System on Chip (SoC).

In various implementations, the electronic device 600 may be one or more components of a data center, a laptop, a netbook, a notebook, an ultrabook, a smartphone, a tablet, a personal digital assistant (PDA), an ultra mobile PC, a mobile phone, a digital camera, or an IoT user equipment. In further implementations, the electronic device 600 may be any other electronic device that processes data.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

Some non-limiting examples are provided below.

EXAMPLES

Example 1 may include a digitized grating, comprising: a first unit cell having a first period and a first length, wherein the first period includes a first grating element width and a first space between adjacent grating elements, and wherein the first length includes a number of first periods; and a second unit cell having a second period and a second length, wherein the second period is different than the first period and includes a second grating element width and a second space between adjacent grating elements, and wherein the second length includes a number of second periods.

Example 2 may include the digitized grating of Example 1 or some other example herein, wherein the digitized grating further comprises one or more additional first unit cells and one or more additional second unit cells.

Example 3 may include the digitized grating of Example 1, 2 or some other example herein, wherein the digitized grating further comprises one or more additional unit cells having one or more additional periods and one or more additional lengths, wherein the one or more additional periods are different than the first period and the second period and includes one or more additional widths and further includes one or more additional spaces between adjacent grating elements, and wherein the one or more additional lengths include a number of the one or more additional periods.

Example 4 may include the digitized grating of Example 1 or some other example herein, wherein a calculation based on the first period, the first length, the second period, and the second length indicates a digitized grating period.

Example 5 may include the digitized grating of Example 4 or some other example herein, wherein the calculation includes the first period multiplied by the first length, which is added to the second period multiplied by the second length to provide a period sum, and the period sum divided by a sum of the first length and the second length.

Example 6 may include the digitized grating of Example 4, 5, or some other example herein, wherein the digitized grating period is defined with a higher resolution than a period of a uniform grating that is based on a mask resolution.

Example 7 may include a laser, comprising: a first region that includes an active region; and a second region coupled with the first region, wherein the second region includes an optical waveguide to carry light generated in the active region, wherein the optical waveguide includes a grating, and wherein the grating includes: a first unit cell having a first period and a first length, wherein the first period includes a first grating element width and a first space between adjacent grating elements, and wherein the first length includes a number of first periods; and a second unit cell having a second period and a second length, wherein the second period is different than the first period and includes a second grating element width and a second space between adjacent grating elements, and wherein the second length includes a number of second periods.

Example 8 may include the laser of Example 7 or some other example herein, wherein the grating includes one or more additional first unit cells and one or more additional second unit cells.

Example 9 may include the laser of Example 7, 8, or some other example herein, wherein a calculation based on the first period, the first length, the second period, and the second length indicates a digitized grating period.

Example 10 may include the laser of Example 9 or some other example herein, wherein the calculation includes the first period multiplied by the first length, which is added to the second period multiplied by the second length to provide a period sum, and the period sum divided by a sum of the first length and the second length.

Example 11 may include the laser of Example 9 or some other example herein, wherein the digitized grating period is defined with a higher resolution than a period of a uniform grating that is based on the mask resolution.

Example 12 may include the laser of Example 7, 8, or some other example herein, wherein the laser is a Distributed Bragg Feedback (DFB) laser or a Distributed Bragg Reflector (DBR) laser.

Example 13 may include one or more non-transitory computer readable media comprising computer readable instructions which, when executed by an electronic device, cause the electronic device to: determine target grating element locations based on a target digitized grating period; generate digitized grating element locations based on the target grating element locations; create a digitized grating based on the digitized grating element locations, wherein the digitized grating includes a number of unit cells having different periods; and provide, based on the different periods, a digitized grating period for the digitized grating.

Example 14 may include the one or more non-transitory computer readable media of Example 13 or some other example herein, wherein the digitized grating period is based on a first period of a first unit cell that includes first grating elements, a second period of a second unit cell that includes second grating elements, a length of the first unit cell, and a length of the second unit cell, wherein the first period is different than the second period.

Example 15 may include the one or more non-transitory computer readable media of Example 14, or some other example herein, wherein the digitized grating period is based on an average that is based on the first period, the first length, the second period, and the second length.

Example 16 may include the one or more non-transitory computer readable media of Example 13, 14, 15, or some other example herein, wherein the one or more non-transitory computer readable media that cause the electronic device to determine the target grating element locations include one or more computer readable media that cause the electronic device to tabulate the target grating element locations.

Example 17 may include the one or more non-transitory computer readable media of Example 13, 14, 15, or some other example herein, wherein the one or more non-transitory computer readable media that cause the electronic device to generate the digitized grating element locations include one or more computer readable media that cause the electronic device to digitally sample the target grating element locations on a mask at an interval that corresponds to a resolution of the mask.

Example 18 may include the one or more non-transitory computer readable media of Example 17 or some other example herein, wherein the one or more non-transitory computer readable media further cause the electronic device to generate the mask based on the digitized grating.

Example 19 may include the one or more non-transitory computer readable media of Example 18 or some other example herein, wherein the one or more non-transitory computer readable media further cause the electronic device to draw a grating on the mask.

Example 20 may include the one or more non-transitory computer readable media of Example 13, 14, 15, or some other example herein, wherein the one or more non-transitory computer readable media that cause the electronic device to create the digitized grating based on the digitized grating element locations, wherein the digitized grating includes the number of unit cells having the different periods, include one or more non-transitory computer readable media that cause the electronic device to modulate a grating period at a regular interval along a grating length.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

We claim:
1. A digitized grating, comprising:
   a first unit cell having a first period and a first length, wherein the first period includes a first grating element width and a first space between adjacent grating elements, and wherein the first length includes a number of first periods;
   a second unit cell having a second period and a second length, wherein the second period is different than the first period and includes a second grating element width and a second space between adjacent grating elements, and wherein the second length includes a number of second periods; and one or more additional first unit cells and one or more additional second unit cells; and wherein the grating has a Bragg wavelength and the Bragg wavelength is given by a digitized grating period which is a period sum divided by a sum of the first length and the second length where the period sum is a sum of the first period multiplied by the first length and the second period multiplied by the second length.

2. The digitized grating of claim 1, further comprising:
one or more additional unit cells having one or more additional periods and one or more additional lengths, wherein the one or more additional periods are different than the first period and the second period and includes one or more additional widths and further includes one or more additional spaces between the adjacent grating elements, and wherein the one or more additional lengths include a number of the one or more additional periods.

3. The digitized grating of claim 1, wherein the digitized grating period is defined with a higher resolution than a period of a uniform grating that is based on a mask resolution.

4. A laser, comprising:
a first region that includes an active region; and
a second region coupled with the first region, wherein the second region includes an optical waveguide to carry light generated in the active region, wherein the optical waveguide includes a grating, and wherein the grating includes:
a first unit cell having a first period and a first length, wherein the first period includes a first grating element width and a first space between adjacent grating elements, and wherein the first length includes a number of first periods; and
a second unit cell having a second period and a second length, wherein the second period is different than the first period and includes a second grating element width and a second space between adjacent grating elements, and wherein the second length includes a number of second periods,
wherein the grating has a Bragg wavelength and the Bragg wavelength is given by a digitized grating period which is a period sum divided by a sum of the first length and the second length where the period sum is a sum of the first period multiplied by the first length and the second period multiplied by the second length.

5. The laser of claim 4, wherein the grating includes one or more additional first unit cells and one or more additional second unit cells.

6. The laser of claim 4, wherein the digitized grating period is defined with a higher resolution than a period of a uniform grating that is based on a mask resolution.

7. The laser of claim 4, wherein the laser is a Distributed Bragg Feedback (DFB) laser or a Distributed Bragg Reflector (DBR) laser.

* * * * *